(12) United States Patent
Lin

(10) Patent No.: US 11,842,792 B2
(45) Date of Patent: Dec. 12, 2023

(54) INTERFACE CIRCUIT, DATA TRANSMISSION CIRCUIT, AND MEMORY

(71) Applicant: CHANGXIN MEMORY TECHNOLOGIES, INC., Anhui (CN)

(72) Inventor: Feng Lin, Shanghai (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 158 days.

(21) Appl. No.: 17/479,184

(22) Filed: Sep. 20, 2021

(65) Prior Publication Data

US 2022/0068334 A1 Mar. 3, 2022

Related U.S. Application Data

(63) Continuation of application No. PCT/CN2021/103707, filed on Jun. 30, 2021.

(30) Foreign Application Priority Data

Aug. 26, 2020 (CN) .......................... 202010874189.2

(51) Int. Cl.
*G11C 7/22* (2006.01)
*G11C 7/10* (2006.01)

(52) U.S. Cl.
CPC ............ *G11C 7/222* (2013.01); *G11C 7/1084* (2013.01); *G11C 7/1093* (2013.01)

(58) Field of Classification Search
CPC .................................. G11C 7/222; G11C 7/22

(Continued)

(56) References Cited

U.S. PATENT DOCUMENTS 5,812,490 A * 9/1998 Tsukude .................. G11C 7/22
365/230.03
6,636,110 B1 * 10/2003 Ooishi ...................... G06F 1/10
327/295

(Continued)

FOREIGN PATENT DOCUMENTS

CN 1641685 A 7/2005
CN 102354519 A 2/2012

(Continued)

OTHER PUBLICATIONS

Supplementary European Search Report in the European application No. 21856926.7, dated Oct. 20, 2022, 9 pgs.

(Continued)

*Primary Examiner* — Muna A Techane
(74) *Attorney, Agent, or Firm* — Cooper Legal Group, LLC

(57) ABSTRACT

An interface circuit, a data transmission circuit and a memory are provided. The interface circuit includes a clock pad, data pads and input buffer circuits, where the clock pad and the data pads are arranged in the first row, and the M data pads are arranged on two sides of the clock pad, half of the M data pads being arranged on each side, where the M input buffer circuits are arranged in the second row and form an axis perpendicular to the first row with the data pads as reference, and the M input buffer circuits are arranged on two sides of the axis, half of the M input buffer circuits being arranged on each side, and where the distance between each input buffer circuit and the axis is smaller than the distance between the data pad corresponding to the input buffer circuit and the axis.

20 Claims, 11 Drawing Sheets

(58) Field of Classification Search
USPC .................................................. 365/233.1
See application file for complete search history.

(56) References Cited

U.S. PATENT DOCUMENTS

| | | |
|---|---|---|
| 7,243,165 B2 | 7/2007 | Kravec |
| 7,444,434 B2 | 10/2008 | Kravec |
| 7,499,516 B2 | 3/2009 | Tripathi |
| 7,502,875 B2 | 3/2009 | Kravec |
| 8,165,257 B2 | 4/2012 | Tripathi |
| 8,743,582 B2 | 6/2014 | Kang |
| 9,245,827 B2 | 1/2016 | Kang et al. |
| 9,459,318 B2 | 10/2016 | Lee |
| 10,573,373 B1 | 2/2020 | Watanabe |
| 2005/0154802 A1 | 7/2005 | Kravec |
| 2006/0109929 A1 | 5/2006 | Tripathi |
| 2007/0150621 A1 | 6/2007 | Kravec |
| 2007/0150622 A1 | 6/2007 | Kravec |
| 2007/0150623 A1 | 6/2007 | Kravec |
| 2009/0141844 A1 | 6/2009 | Tripathi |
| 2009/0303827 A1 | 12/2009 | Kim |
| 2010/0054047 A1 | 3/2010 | Lee |
| 2011/0292708 A1 | 12/2011 | Kang |
| 2014/0233292 A1 | 8/2014 | Kang et al. |
| 2015/0177320 A1* | 6/2015 | Lee .................... G01R 31/2803 714/727 |
| 2019/0371374 A1 | 12/2019 | Uemura et al. |
| 2020/0312402 A1 | 10/2020 | Watanabe |

FOREIGN PATENT DOCUMENTS

| | | |
|---|---|---|
| CN | 104733050 A | 6/2015 |
| CN | 208954638 U | 6/2019 |
| CN | 209087410 U | 7/2019 |
| CN | 111105826 A | 5/2020 |
| CN | 210805229 U | 6/2020 |
| CN | 210805230 U | 6/2020 |
| JP | 2000163994 A | 6/2000 |
| JP | 2004126772 A | 4/2004 |
| JP | 2006209638 A | 8/2006 |
| JP | 2008225956 A | 9/2008 |
| JP | 2009009633 A | 1/2009 |

OTHER PUBLICATIONS

International Search Report in the international application No. PCT/CN2021/103707, dated Sep. 28, 2021, 2 pgs.
First Office Action of the Japanese application No. 2022-539728, dated Apr. 11, 2023. 10 pages with English translation.

* cited by examiner

US 11,842,792 B2

INTERFACE CIRCUIT, DATA TRANSMISSION CIRCUIT, AND MEMORY

CROSS-REFERENCE TO RELATED APPLICATIONS

This is a continuation application of International patent application No. PCT/CN2021/103707, filed on Jun. 30, 2021, which claims priority to Chinese Patent Application No. 202010874189.2, filed on Aug. 26, 2020 and entitled "Interface circuit, data transmission circuit, and memory". The disclosures of International patent application No. PCT/CN2021/103707 and Chinese Patent Application No. 202010874189.2 are hereby incorporated by reference in their entireties.

TECHNICAL FIELD

Embodiments of the disclosure relate to an interface circuit, a data transmission circuit, and a memory.

BACKGROUND

A Dynamic Random Access Memory (DRAM) is a semiconductor memory device commonly used in computers and consists of many repeated memory units. Each memory unit generally includes a capacitor and a transistor. The gate of the transistor is connected with a word line, the drain of the transistor is connected with a bit line, and the source of the transistor is connected with the capacitor. A voltage signal on the word line may control the transistor to be turned on or off, so that data information stored in the capacitor is read through the bit line, or the data information is written into the capacitor for storage through the bit line.

DRAMs may be divided into Double Data Rate (DDR) DRAMs, Graphics Double Data Rate (GDDR) DRAMs, and Low Power Double Data Rate (LPDDR) DRAMs. With the DRAM being applied in more fields, such as increasingly used in the mobile field, the requirements of users on indicators such as speed and power consumption of the DRAM are higher and higher.

SUMMARY

Embodiments of the disclosure provide an interface circuit, which includes a clock pad configured to transmit a clock signal; M data pads configured to transmit data signals; and M input buffer circuits in one-to-one correspondence with the data pads, each of the input buffer circuits being driven by the clock signal to receive a data signal transmitted by a data pad corresponding to the input buffer circuit. The clock pad and the data pads are arranged in the first row, and the M data pads are arranged on two sides of the clock pad, half of the M data pads being arranged on each side. The M input buffer circuits are arranged in the second row and form an axis perpendicular to the first row with the clock pad as reference, and the M input buffer circuits are arranged on two sides of the axis, half of the M input buffer circuits being arranged on each side. A distance between each of the input buffer circuits and the axis is smaller than a distance between a data pad corresponding to the input buffer circuit and the axis, M being an integer larger than or equal to 2.

The embodiments of the disclosure further provide a data transmission circuit, which includes the interface circuit as described above, and M sequential-to-parallel conversion circuits. The M sequential-to-parallel conversion circuits are in one-to-one correspondence with the M input buffer circuits, and an output of each of the input buffer circuit serves as an input of the corresponding sequential-to-parallel conversion circuit.

The embodiments of the disclosure further provide a memory, including the interface circuit as described above.

DETAILED DESCRIPTION

In a memory, a write data sampling signal (Dqs signal or Wck signal) is used as a clock of write data; and at the time of a write operation, edges (rising and falling edges) of the Dqs signal or Wck should be aligned in timing with the center of a data signal (DQ signal) (which may also allow substantial alignment in the center when taking timing margins into account). A transmission path of the DQ signal is defined as a data path, and the length of the data path may affect the time when the edges of the DQ signal reach a data port of a device (such as data port of a register). A transmission path of the Dqs or Wck signal is defined as a clock path, and the length of the clock path may affect the time when the Dqs or Wck signal reaches a clock port of a device (such as clock port of the register). The difference (i.e., the time interval between the edge of the Dqs or Wck signal and the center of the DQ signal) between the data path of the DQ signal and the clock path of the Dqs or Wck signal is defined as tDQS2DQ or tWCK2DQ, the smaller the tDQS2DQ or the tWCK2DQ is, the more the data path is matched with the clock path, and the better the circuit timing is correspondingly.

Figure 1:
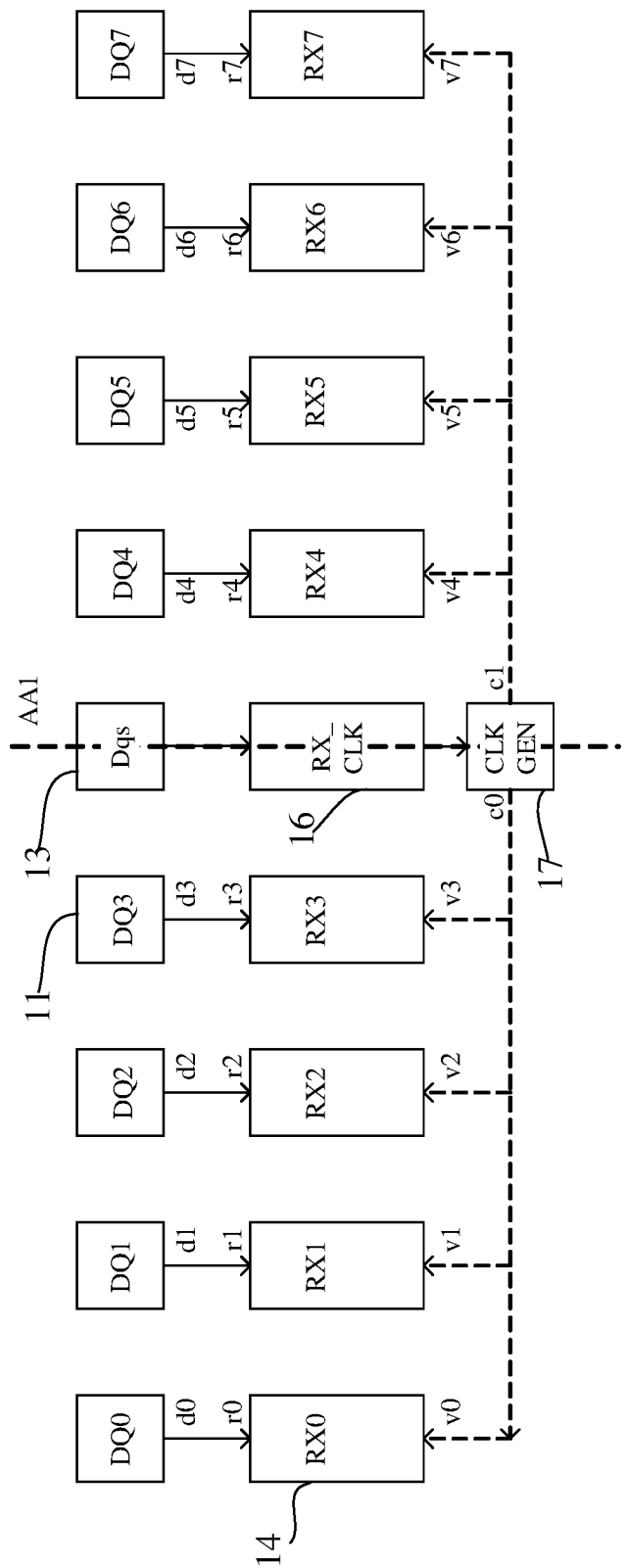
FIG. 1 is a structural schematic diagram of an interface circuit.

A specific analysis will be carried out in combination with FIG. 1. FIG. 1 is a structural schematic diagram of an interface circuit.

Referring to FIG. 1, the interface circuit includes: a plurality of data pads 11 configured to transmit data signals and arranged side by side with a central axis AA1, where half of the plurality of data pads 11 are distributed on one side of the central axis AA1 and the other half are distributed on the other side of the central axis AA1; a clock pad 13 located at the central axis AA1; a plurality of input buffer circuits 14 corresponding to the data pads 11. The data paths between the input buffer circuits 14 and the corresponding data pads 11 are the same or substantially the same within a certain error range. Considering that it is only an ideal case that the paths are the same during actual circuit design and manufacturing, the paths being the same herein and hereafter includes the meaning of being substantially the same within a certain error range, and the certain error range here may be understood as but not limited to an error between different paths within 1% or within 3%. The interface circuit further includes: a plurality of output buffer circuits (not illustrated) corresponding to the data pads 11 and having the same timing path between each output buffer circuit and the corresponding data pad 11; and a clock receiving circuit 16 and a clock generating circuit 17, where the clock receiving circuit 16 is electrically connected with the clock pad 13 and configured to receive a clock signal and transmit the clock signals to the clock generating circuit 17, the clock generating circuit 17 receives the clock signal and generates a driving clock, and the input buffer circuits 14 receive the driving clock and the data signals and transmits the data signals.

In FIG. 1, the data pads 11 are denoted by DQ0/DQ1 . . . DQ7, the clock pads 13 are denoted by Dqs (hereinafter taking Dqs as an example, Wck is used in the same or similar case as Dqs, for example, the clock is referred to as Dqs in LPDDR4, and the clock is referred to as Wck in LPDDR5), the input buffer circuits 14 are denoted by RX0/RX1 . . . RX7, and are also receiving circuits, the clock receiving circuit 16 is denoted by RX_CLK, and the clock generating circuit 17 is denoted by CLK GEN.

A data path through which the data signal of a data pad 11 is transmitted to the corresponding input buffer circuit 14 is a first path, and a timing path through which the clock signal of the clock pad 13 is transmitted to the corresponding input buffer circuit 14 is a second path. In FIG. 1, different input buffer circuits 14 have the same first path, but the input buffer circuit 14 further from the clock pad 13 has a longer second path. Therefore, the further from the clock pads 13, the difference between the first path and second path becomes larger, resulting in a larger corresponding tDQS2DQ, and the problem of timing violations is more severe. tDQS2DQ corresponding to the input buffer circuit 14 furthest from the clock pads 13 is shown in FIG. 1.

The time at which the data signals of different data pads 11 reach the corresponding input buffer circuits 14 is close to each other. By taking the input buffer circuits 14 furthest and closest to the clock pad 13 in FIG. 1 as an example, the time at which the clock signal reaches the input buffer circuit 14 (i.e., an input buffer circuit 14 corresponding to DQ0) furthest from the clock pad 13 is the latest, the time at which the clock signal reaches the input buffer circuit 14 (i.e., an input buffer circuit 14 corresponding to DQ3) closest to the clock pad 13 is the earliest, so that the input buffer circuit 14 closest to the clock pads 13 firstly receives and transmits the data signal, and the input buffer circuit 14 furthest from the clock pads 13 transmits the data signal latest, and the time difference between the two input buffer circuits 14 for transmitting the data signals is large. Accordingly, if the clock path and the data path for an input buffer circuit 14 corresponding to DQ3 are matched, the clock path and the data path for an input buffer circuit 14 corresponding to DQ0 are less likely to match.

Specifically, in combination with FIG. 1, each of the data pads 11 has a respective first port d0/d1 . . . d7, each of the input buffer circuits 14 has a respective second port r0/r1 . . . r7 connected with the first port of the respective data pad 11, each of the input buffer circuits 14 has a respective third port v0/v1 . . . v7 connected with the clock generating circuit 17, the clock generating circuit 17 has a fourth port c0 connected to each of the input buffer circuits 14 located on one side of the central axis AA1, and the clock generating circuit 17 also has a fifth port c1 connected to each of the input buffer circuits 14 located on the other side of the central axis AA1. For RX0, the clock path of the clock signal is c0→v0, and the data path of the data signals is d0→r0; for RX1, the clock path of the clock signal is c1→v1, and the data path of the data signals is d1→r1; and so on. It is easily found that for different input buffer circuits 14, the corresponding data paths do not change, but the input buffer circuit 14 closer to the center axis AA1 has a shorter clock path, and thus, the problem of a larger difference in tDQS2DQ arises.

From the above analysis, tDQS2DQs corresponding to different input buffer circuits 14 differ greatly, and there are strict requirements on the value of tDQS2DQ in the memory. For example, it is required that the value of tDQS2DQ is not greater than 800 µs, or otherwise it will cause timing violations.

In order to solve the above problem, the embodiment of the disclosure provides an interface circuit, which shortens the clock path for transmission of the clock signals to each input buffer circuit by centrally arranging the input buffer circuits, so that tDQS2DQ is shortened, and thus the problem of timing violations is improved. The interface circuit according to the embodiment of the disclosure will be described in detail below with combination with the drawings.

Figure 2:
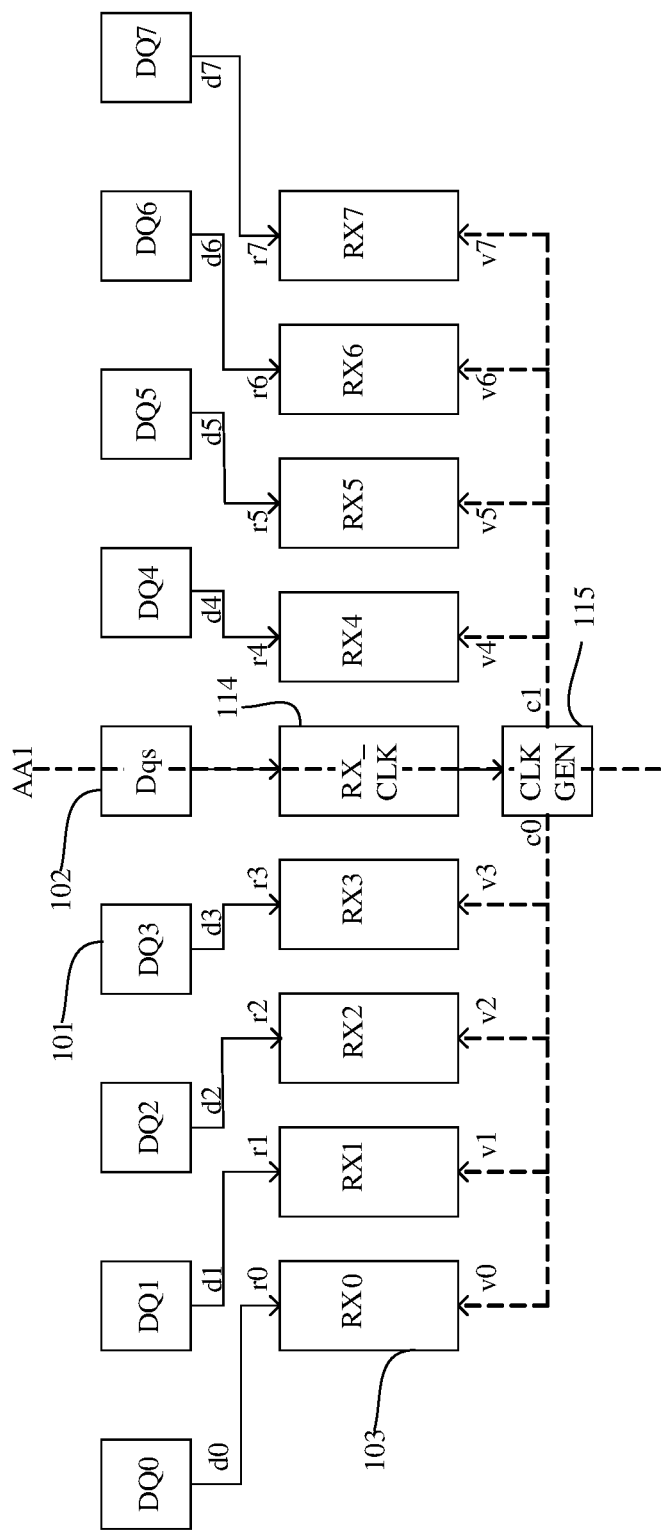
FIG. 2 is a structural schematic diagram of an interface circuit according to an embodiment of the disclosure.

FIG. 2 is a structural schematic diagram of an interface circuit according to an embodiment of the disclosure.

Referring to FIG. 2, in the embodiment, the interface circuit includes: a clock pad 102 configured to transmit a clock signal; M data pads 101 configured to transmit data signals; and M input buffer circuits 103 in one-to-one correspondence with the data pads 101, each input buffer circuit 103 being driven by the clock signal to receive the data signal transmitted by a data pad 101 corresponding to the input buffer circuit 103. The clock pad 102 and the data pads 101 are arranged in a first row, and the M data pads 101 are arranged on two sides of the clock pads 102, where half of the M data pads 101 are arranged on each side. The M input buffer circuits 103 are arranged in a second row and form an axis AA1 perpendicular to the first row with the clock pads 102 as reference, and the M input buffer circuits 103 are arranged on two sides of the axis AA1, where half of the M input buffer circuits 103 are arranged on each side. The distance between each input buffer circuit 103 and the axis AA1 is smaller than the distance between a data pad 101 corresponding to the input buffer circuit 103 and the axis AA1, where M is an integer larger than or equal to 2. When M is an even number, for example, M is equal to 8, then 4 data pads 101 are arranged on each side of the axis AA1; and when M is an odd number, for example, M is equal to 7, then 3 data pads 101 are arranged on one side of the axis AA1 and 4 data pads 101 are arranged on the other side. The "half" as referred to above should be understood as M/2 when M is an even number, and should be understood as (M−1)/2 or (M+1)/2 when M is an odd number, and the same interpretation applies to the "half" below.

The M data pads and the clock pad are arranged in a first row, and the M data pads are arranged on two sides of the clock pad and form an axis perpendicular to the first row with the clock pad as reference. The M input buffer circuits are arranged on two sides of the axis, half of the M input buffer circuits are arranged on each side, and the distance between each input buffer circuit and the axis is smaller than the distance between the data pad corresponding to the input buffer circuit and the axis. In some embodiments of the disclosure, the input buffer circuits are centrally processed, so that the clock path through which the clock signals are transmitted to each input buffer circuit is shortened, the matching degree of the clock path and the data path is improved, and thus tDQS2DQ and timing violations are favorably reduced. In addition, the clock path is shortened, so that the power loss of the interface circuit is reduced.

The interface circuit according to the embodiment of the disclosure will be described in detail below in combination with the drawings.

In the embodiment, the interface circuit may be applied to a DRAM, such as LPDDR4.

In the embodiment, half of the M data pads 11 are located on one side of the axis AA1 and the other half of the M data pads 11 are located on the other side of the axis AA1. The data pads 101 are configured to transmit DQ signals, that is, the data signals are DQ signals.

In FIG. 2, 8 data pads 101 are illustrated, and the data pads 101 are denoted by DQ0, DQ1, DQ2, DQ3, DQ4, DQ5, DQ6, DQ7; and accordingly, the number of the input buffer circuits 103 is also 8, and the input buffer circuit 103 are denoted by RX0, RX1, RX2, RX3, RX4, RX5, RX6, and RX7. It can be understood that in other embodiments, the number of the data pads may be reasonably set according to actual requirements of the interface circuit.

The clock pad 102 may be configured to transmit Dqs signal, that is, the clock signal is the Dqs signal, which refers to a write clock signal or read clock signal. The clock pad 102 are denoted by Dqs in FIG. 2.

Figure 3:
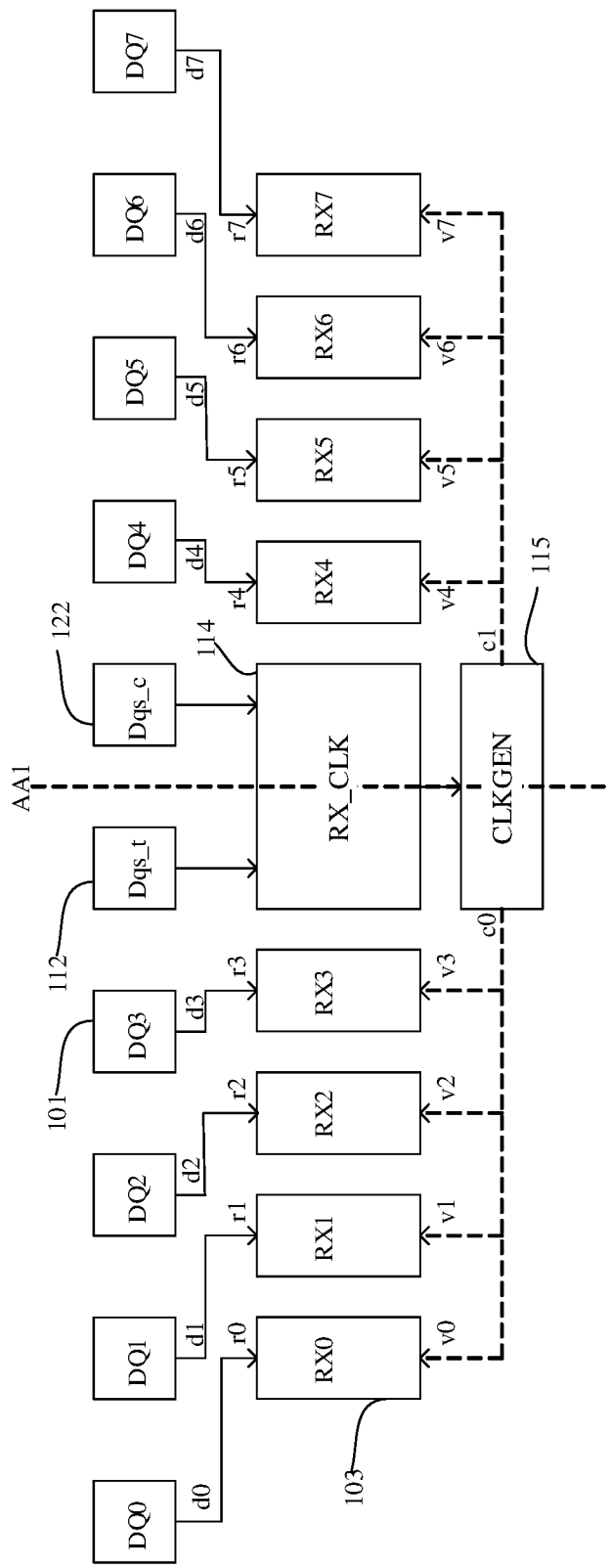
FIG. 3 is another structural schematic diagram of an interface circuit according to an embodiment of the disclosure.

FIG. 3 is another structural schematic diagram of an interface circuit according to an embodiment of the disclosure. As shown in FIG. 3, the clock pad 102 may be a differential input pad and includes a first clock pad 112 and a second clock pad 122, and the first clock pad 112 and the second clock pad 122 respectively transmit complementary clock signals. Specifically, in FIG. 3, the first clock pad 112 is denoted by Dqs_t and configured to transmit Dqs_t clock signal; and the second clock pad 122 is denoted by Dqs_c and configured to transmit Dqs_c clock signal.

In the embodiment, the first clock pad 112 and the second clock pad 122 are symmetrically arranged relative to the axis AA1. The clock path between the first clock pad 112 and the input buffer circuits 103 located on one side of the axis AA1 is a first clock path, and the clock path between the second clock pad 122 and the input buffer circuits 103 located on the other side of the axis AA1 is a second clock path, and in this arrangement, the difference between the first clock path and the second clock path is reduced, and thus adverse effects on tDQS2DQ caused by large difference between the first clock path and the second clock path are reduced or avoided.

It is to be noted that in other embodiments, the first clock pad and the second clock pad may also be arranged on the same side of the axis.

It is also to be noted that the "first row" does not mean that the clock pad 102 and the data pad 101 are located in the first row in the overall pads of the interface circuit, but is only to indicate that the clock pad 102 and the data pads 101 are arranged in the same row, so as to illustrate the axis AA1 for convenience. In an actual interface circuit, the clock pad 102 and the data pads 101 may be located in any row in the overall pads of the interface circuit.

Similarly, the "second row" does not mean that the input buffer circuits 103 are located in the second row in the overall pads of the interface circuit, but is only to indicate that the M input buffer circuits 103 are arranged in the same row and located in a different row from the clock pads 102 and the data pads 101. In an actual interface circuit, the M input buffer circuits 103 may be located in any row of the overall pads of the interface circuit, and one or more rows of pads may be further arranged between the input buffer circuits 103 and the data pads 101.

In the embodiment, the interface circuit may further include a clock processing circuit, which is electrically connected with the clock pad 102 and the M input buffer circuits 103 and configured to receive the clock signal and process the clock signals to serve as a driving clock of the M input buffer circuits 103. That is, the input buffer circuits 103 being driven by the clock signal is actually that the input buffer circuits 103 are driven by the drive clock generated by processing the clock signal.

The clock processing circuit coincides with the axis AA1, that is, the clock processing circuit is located at a position where axis AA1 is located. In this way, it is advantageous to reduce the difference between the clock paths required for transmission of the drive clocks to the input buffer circuits 103 on both sides of the axis AA1. The clock processing circuit being located at the position of the axis AA1 does not mean that the clock processing circuit is completely symmetrical with respect to the axis AA1. Considering the practical circumstances of circuit design and manufacturing, the clock processing circuit is approximately located at AA1, allowing its centerline to deviate from AA1 by a certain value, such as by 10% or 20%.

In the embodiment, the clock processing circuit includes a clock receiving circuit 114 and a clock generating circuit 115. The clock receiving circuit 114 is electrically connected with the clock pad 102 and configured to receive the clock signal, the output of the clock receiving circuit 114 serves as the input of the clock generating circuit 115, and the clock generating circuit 115 is configured to generate the driving clock. The clock generating circuit 115 is located on the axis AA1. In FIG. 2, the clock receiving circuit 114 is denoted by RX_CLK, and the clock generating circuit 115 is denoted by CLK GEN.

Specifically, the clock receiving circuit 114 includes: a first clock receiving circuit, electrically connected to the first clock pad 112 and configured to receive the Dqs_t clock signal; and a second clock receiving circuit, electrically connected to the second clock pad 122 and configured to receive the Dqs_c clock signal. The first clock receiving circuit and the second clock receiving circuit are symmetrically arranged relative to the axis AA1.

The input buffer circuits 103 are driven by the clock signal to receive the data signals and continue to transmit the data signals. That is, when the data signals of the data pads 101 are transmitted to the input buffer circuits 103, the input buffer circuits 103 receive the data signals and transmit the data signals out only when the clock signal is also transmitted to the input buffer circuits 103. If the data signals are transmitted to the input buffer circuits 103 and the clock signals have not reached the input buffer circuits 103, the input buffer circuits 103 do not transmit the data signals.

In the embodiment, the distance between each of the input buffer circuits 103 and the axis AA1 is smaller than the distance between a data pad 101 corresponding to the input buffer circuit 103 and the axis AA1, that is, the input buffer circuits 103 are closer to the axis AA1 than the data pads 101. Specifically, based on the axis AA1, the layout density of the M input buffer circuits 103 is greater than the layout density of the M data pads 101; and for each data pad 101 and the corresponding input buffer circuit 103, the distance between the data pad 101 and the axis AA1 is greater than the distance between the input buffer circuit 103 and the axis AA1. Furthermore, when the data pad 101 is closer to the axis AA1, the input buffer circuit 103 corresponding to the data pad 101 becomes closer to the axis AA1.

Specifically, the length of an input data path between each input buffer circuit 103 and a data pad 101 corresponding to the input buffer circuit 103 is a first length, the length of a clock path between each input buffer circuit 103 and the clock pad 102 is a second length, and the first length and the second length are in positive correlation. That is, for all of the input buffer circuits 103, the second length becomes larger as the first length is larger, and the second length becomes smaller as the first length is smaller. That is, when the data pad 101 is further from the axis AA1, the corresponding input buffer circuit 103 becomes further from the axis AA1; and when the data pad 101 is closer to the axis AA1, the corresponding input buffer circuit 103 becomes closer to the axis AA1.

Compared with the solution that the distance between each input buffer circuit and the axis is equal to the distance between the corresponding data pad and the axis shown in FIG. 1, in the embodiment, for each data pad 101 and each input buffer circuit 103 on the same side of the axis AA1, the clock path of the input buffer circuit 103 furthest from the clock pad 102 is reduced, so that the clock signal may be transmitted to the input buffer circuit 103 furthest from the clock pad 102 more quickly, and thus the signal delay time caused by the fact that the data signals have reached the input buffer circuit but the clock signals have not reached is reduced. Correspondingly, the clock path of each of the input buffer circuits 103 is reduced, so that the signal delay time of all the input buffer circuits 103 may be correspondingly reduced. That is, in the embodiment, tWCK2DQ may be reduced, timing violations may be reduced, and power consumed on the clock path may be reduced.

In addition, the difference between the data path between each data pad 101 and the input buffer circuit 103 and the clock path between each clock pad 102 and the input buffer circuit 103 is reduced, so that tDQS2DQs of different input buffer circuits 103 may be shortened. Therefore, the matching degree of the clock paths and data paths of different input buffer circuits is improved, and the timing characteristic of data signal transmission in different input buffer circuits 103 is improved.

Specifically, in combination with FIG. 2, each of the data pads 101 has a respective first port d0/d1 . . . d7, each of the input buffer circuits 103 has a respective second port r0/r1 . . . r7 connected with the first ports of the corresponding data pads 101, each of the input buffer circuits 14 has a respective third port v0/v1 . . . v7 connected with the clock generating circuit 115. The clock generating circuit 115 has a fourth port c0 connected to each of the input buffer circuits 14 located on one side of the central axis AA1, and the clock generating circuit 115 also has a fifth port c1 connected to each of the input buffer circuits 14 located on the other side of the central axis AA1. For RX0, the clock path of the clock signal is c0→v0, and the data path of the data signal is d0→r0; for RX1, the clock path of the clock signal is c1→v1, and the data path of the data signals is d1→r1; and so on.

For example, the data signal of a data pad 101 denoted by DQ0 in FIG. 2 are transmitted to a corresponding input buffer circuit 103 via a transmission path of a first length, the corresponding input buffer circuit is denoted by RX0 in FIG. 2, and the clock signal is transmitted to the corresponding input buffer circuit 103 via a transmission path of a second length; where the first length refers to a length from point d0 to point v0, and the second length refers to a length from point c0 to point v0. When the data signal is transmitted to RX0, the clock signal is transmitted to RX0 after time of t1, so that the RX0 may transmit the data signal out within a waiting time t1 after receiving the data signal. As the data pads 101 denoted by DQ0 transmits the data signal at a higher and higher rate, the time for DQ0 to maintain a high level "1" or a low level "0" becomes shorter and shorter, thereby requiring the waiting time t1 to be smaller and smaller and the first length (corresponding to the data path) matches the second length (corresponding to the clock path) as much as possible.

In FIG. 2, the data signal of the data pad 101 denoted by DQ3 are transmitted to a corresponding input buffer circuit 103 via a transmission path of a first length, the corresponding input buffer circuit 103 is denoted by RX3 in FIG. 2, and the clock signal is transmitted to the corresponding input buffer circuit 103 via a transmission path of a second length; where the first length refers to a length from point d3 to point v3, and the second length refers to a length from point c0 to point v3. When the data signal is transmitted to the input buffer circuit 103, the clock signal is transmitted to RX3 after the time of t2, so that RX3 may transmit the data signal out within a waiting time t2 after receiving the data signal. For the data pads 101 denoted by DQ0 and DQ3, t1 and t2 are equal or approximately equal because the first and second lengths of the input buffer circuit 103 corresponding to DQ0 are matched, and the first and second lengths of the input buffer circuit 103 corresponding to DQ3 are also matched. Therefore, in the embodiment, the consistency of RX0 and RX3 transmitting the data signal may be improved.

Furthermore, in combination with FIG. 2, it is not difficult to find that the data paths are different for each of the input buffer circuits 103, and that the clock paths are different for each of the input buffer circuits 103. For different input buffer circuits 103, the clock path becomes longer as the data path is longer. Therefore, in the embodiment, the time consistency of different input buffer circuits 103 transmitting data signals may be improved, that is, a better timing characteristic may be achieved.

Figure 4:
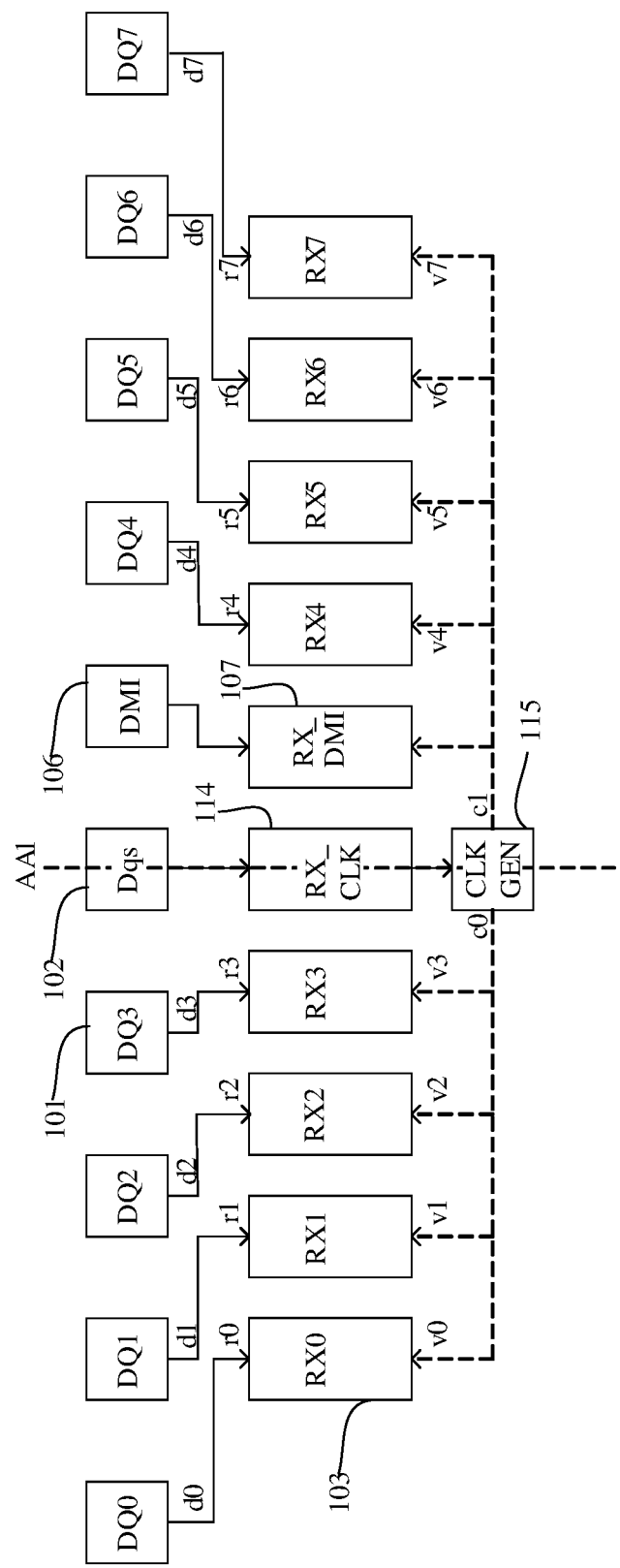
FIG. 4 is still another structural schematic diagram of an interface circuit according to an embodiment of the disclosure.

FIG. 4 is still another structural schematic diagram of an interface circuit according to an embodiment of the disclosure. As shown in FIG. 4, the interface circuit may further include: a mark pad 106, configured to transmit a mark signal; a mark buffer circuit 107 corresponding to the mark pad 106 and configured to receive the mark signal transmitted by the mark pad 106 under the driving of clock signal; and a mark output buffer circuit (not labeled).

The mark signal is generally referred to as data mask inverter for indicating whether each data signal is inverted or not, and the mark pad 106 is generally referred to as DMI (data mask inverter) pad, DM pad, or DBI pad. In FIG. 4, the mark pad 106 is denoted by DMI, and the mark buffer circuit 107 is denoted by DMI_RX.

In the embodiment, the mark pad 106 is arranged in the first row and located between the data pads 101 and the clock pad 102. The mark buffer circuit 107 is arranged in the second row, located on the same side of the axis AA1, and located between the input buffer circuits 103 and the axis AA1.

In addition, the distance between the mark buffer circuit 107 and the axis AA1 is smaller than the distance between the mark pad 106 corresponding to the mark buffer circuit 107 and the axis AA1.

Figure 5:
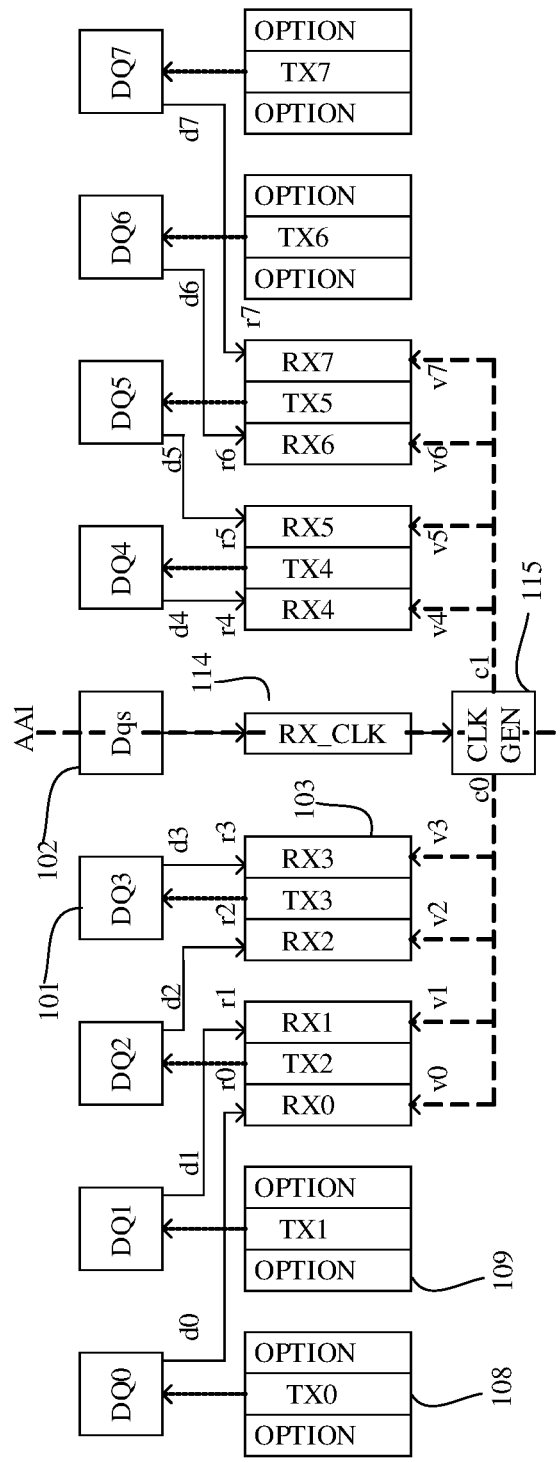
FIG. 5 is a layout schematic diagram of an interface circuit according to an embodiment of the disclosure.

FIG. 5 is a layout schematic diagram of an interface circuit according to an embodiment of the disclosure. As shown in FIG. 5, the interface circuit may further include M output buffer circuits 108 in one-to-one correspondence with data pads 101, and each output buffer circuit 108 is driven by the clock signal to transmit the data signal to the corresponding data pad 101. The output buffer circuits 108 are electrically connected to clock pad in addition to the data pads 101. Eight output buffer circuits 108 are denoted by TX0, TX1, TX2, TX3, TX4, TX5, TX6 and TX7 in FIG. 5.

Specifically, the output buffer circuits 108 are electrically connected to the clock pad 102 via a clock receiving circuit 114 and a clock generating circuit 115.

In the embodiment, the lengths of output data paths from the output buffer circuits 108 to the data pads 101 corresponding to the output buffer circuits 108 are the same. Specifically, each output buffer circuit 108 is located directly below the corresponding data pad 101, or the distance between each output buffer circuit 108 and the axis AA1 is equal to the distance between the corresponding data pad 101 and the axis AA1. Likewise, considering the practical circumstances of circuit design and manufacturing, the lengths or distances being equal may also be approximately equal, allowing for certain errors, and similar descriptions will not be described in detail later.

Each input buffer circuit 103 may include a multiplexer (mux) and a latch, the multiplexer receives and processes data signals, and outputs the processed data signal to the latch, and the output of the latch serves as the output of the input buffer circuit 103.

The interface circuit may further include a plurality of power supply pads (not illustrated) and ground pads (not illustrated) which are configured for grounding or connecting with a fixed power supply. The plurality of power supply pads and the ground pads are located in the same row as the data pads.

As shown in FIG. 5, the interface circuit may further include M optional input buffer circuits 109, which have the same number as the input buffer circuits 103 and are arranged side by side with the input buffer circuits 103, and the optional input buffer circuits 109 are denoted by OPTION in FIG. 5. Specifically, in the embodiment, the optional input buffer circuits 109 are located on two sides of the input buffer circuits 103 corresponding to the four data pads 101 furthest from the center axis AA1. The optional input buffer circuits 109 described above, for example if not selected, may function as DUMMY, that is, as virtual input buffer circuits for operating environment matching. In some cases, the optional input buffer circuits 109 may be reselected by configuration.

Figure 6:
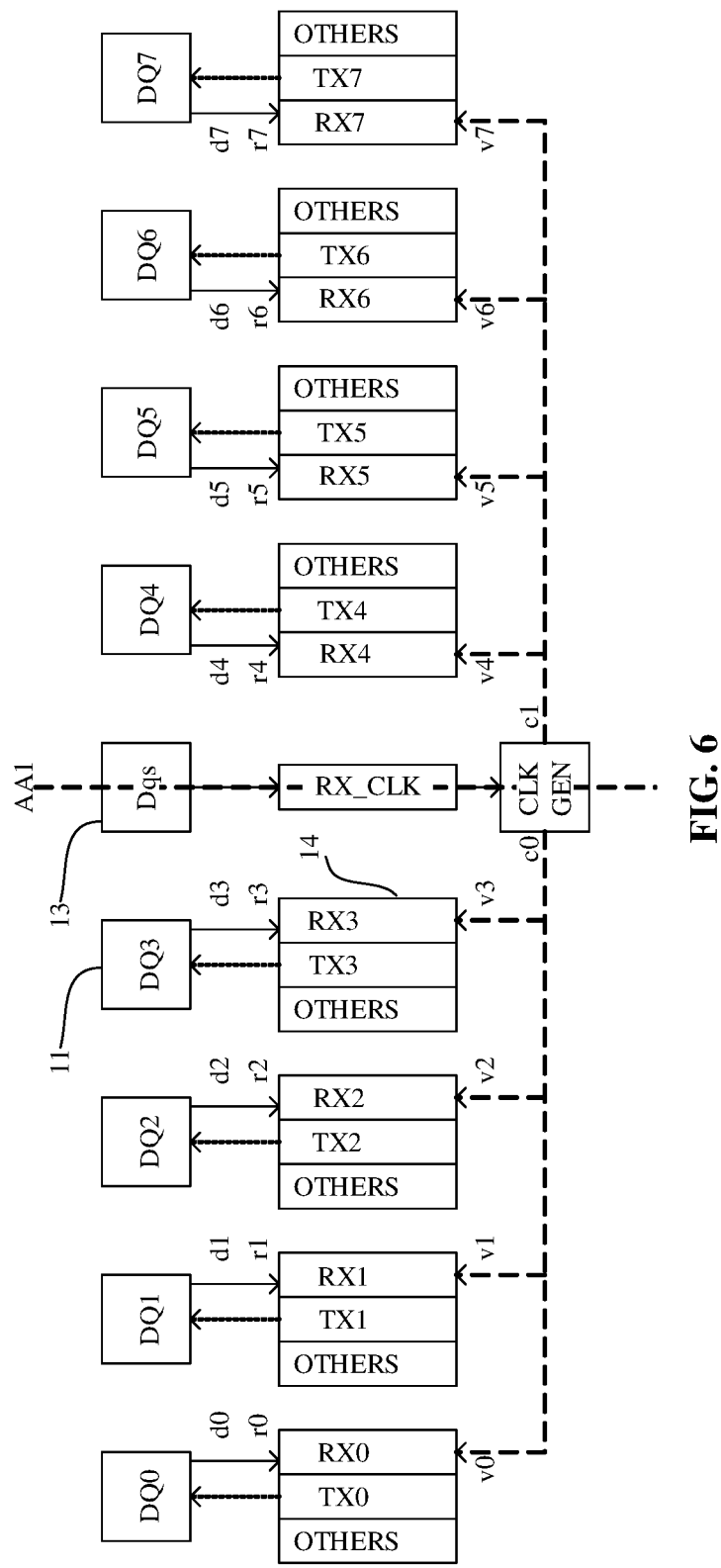
FIG. 6 is a layout schematic diagram corresponding to an interface circuit according to an embodiment of the disclosure.

FIG. 6 is a layout schematic diagram corresponding to an interface circuit provided in FIG. 1. Output buffer circuits and a capacitor are available in FIG. 6, it is to be noted that for ease of comparison, the output buffer circuits are also denoted by RX0, RX1 . . . RX7 in FIG. 6, and other circuits are denoted by OTHERS in FIG. 6 with OTHERS, which may be a capacitor, for example.

With reference to FIG. 5 and FIG. 6 in combination, based on the clock generating circuit, the layout density of the input buffer circuits 103 in FIG. 5 is greater than that of the input buffer circuits in FIG. 6. Taking DQ6 as an example, the clock path through which the clock signal reaches an input buffer circuit corresponding to DQ6 in FIG. 5 is shorter than the clock path through which the clock signal reaches an input buffer circuit corresponding to DQ6 s in FIG. 6.

Figure 7:
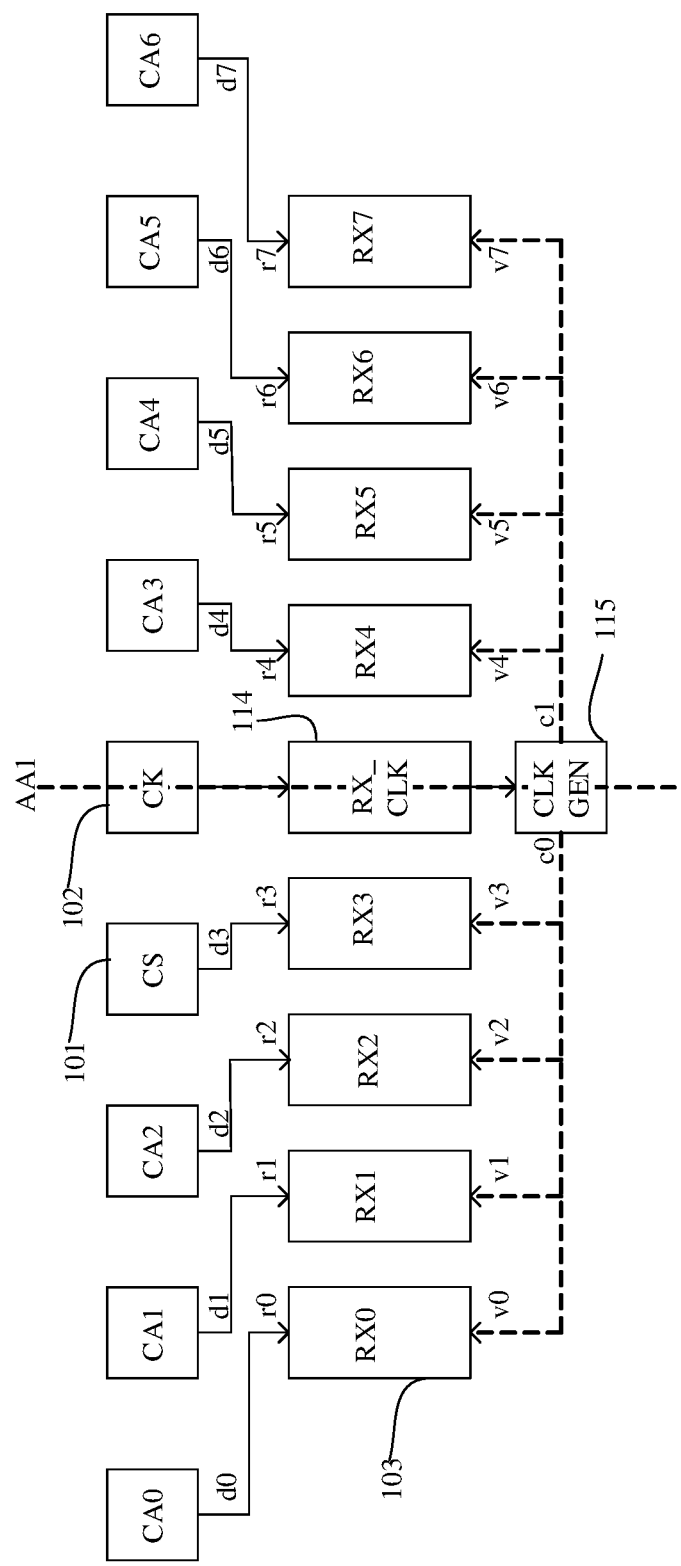
FIGS. 7-9 are four structural schematic diagrams of an interface circuit in which a data pad includes command pads and address pads according to an embodiment of the disclosure.
Figure 8:
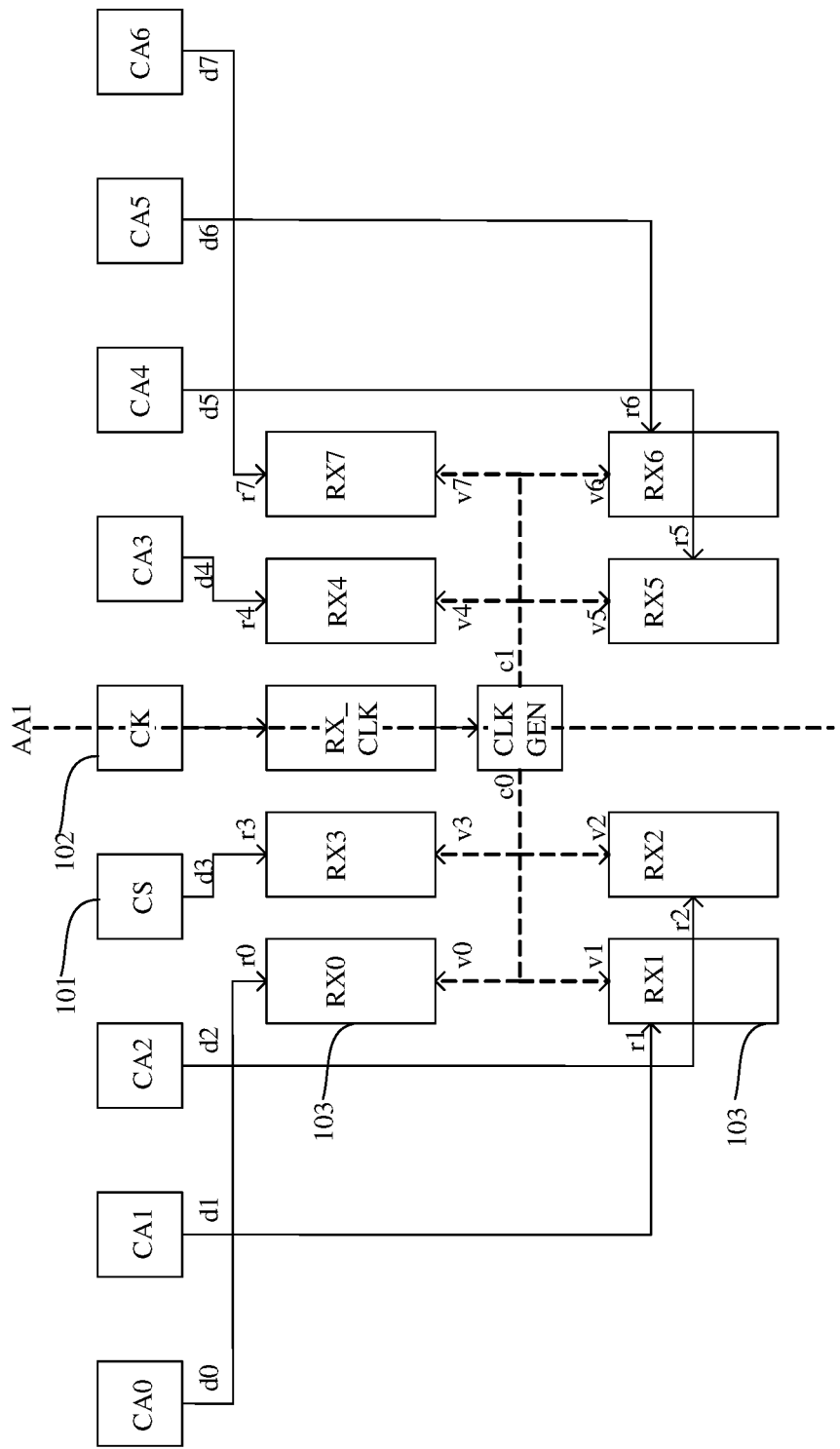
Figure 9:
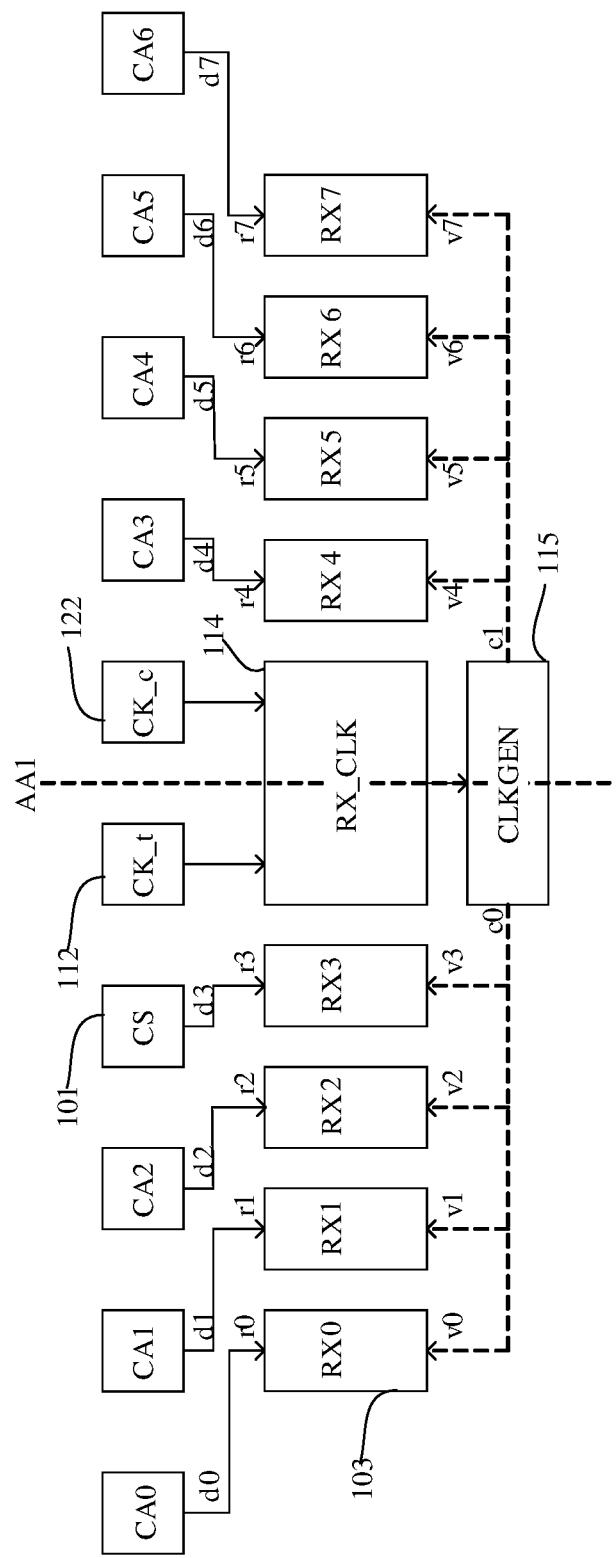

In all the examples described above, the data pads 101 are DQ pads, and the data signals are DQ signals. It will be appreciated that in other embodiments, the data pads may also be command/address pads or chip select pads, the corresponding data signals may be command signals or address signals, and the interface circuit may be applied to LPDDR5. FIGS. 7-9 are four structural schematic diagrams of an interface circuit in which data pads include command pads and address pads according to an embodiment of the disclosure.

As shown in FIG. 7, the data pad 101 includes a plurality of command/address pads and one chip select pad, where the command/address pads are denoted by CA0/CA1/CA2/CA3/CA4/CA5/CA6 and the chip select pad is denoted by CS. The command/address pads transmit command/address signals, and the chip select pad transmits a chip select signal. The clock pad 102 is denoted by CK.

In one example, as shown in FIG. 7, all input buffer circuits 103 are in the same row.

In another example, as shown in FIG. 8, some of the input buffer circuits 103 are in the same row, and the remaining input buffer circuits 103 are in another row. Specifically, half of all the input buffer circuits 103 may be arranged in the same row, the other half are arranged in another same row, the input buffer circuits 103 corresponding to the data pads 101 may be randomly selected to be in the same row, so that the length of the input data path between each input buffer circuit 103 and the data pad 101 corresponding to the input buffer circuit 103 is a first length, the length of the clock path between each input buffer circuit 103 and the clock pad 102 is a second length, and the first length and the second length are in positive correlation.

As shown in FIG. 9, the clock pad may include a first clock pad 112 and a second clock pad 122. The first clock pad 112 is denoted by CK_t and the second clock pad 122 is denoted by CK_c.

For the detailed description of the input buffer circuits 103, reference is made to the foregoing detailed description, which is not repeated here. As previously analyzed, after the interface circuit as shown in FIGS. 7-9 is adopted, the beneficial effects of reducing tDQS2DQ, reducing timing violations, and reducing power consumed on the clock paths are also achieved.

Figure 10:
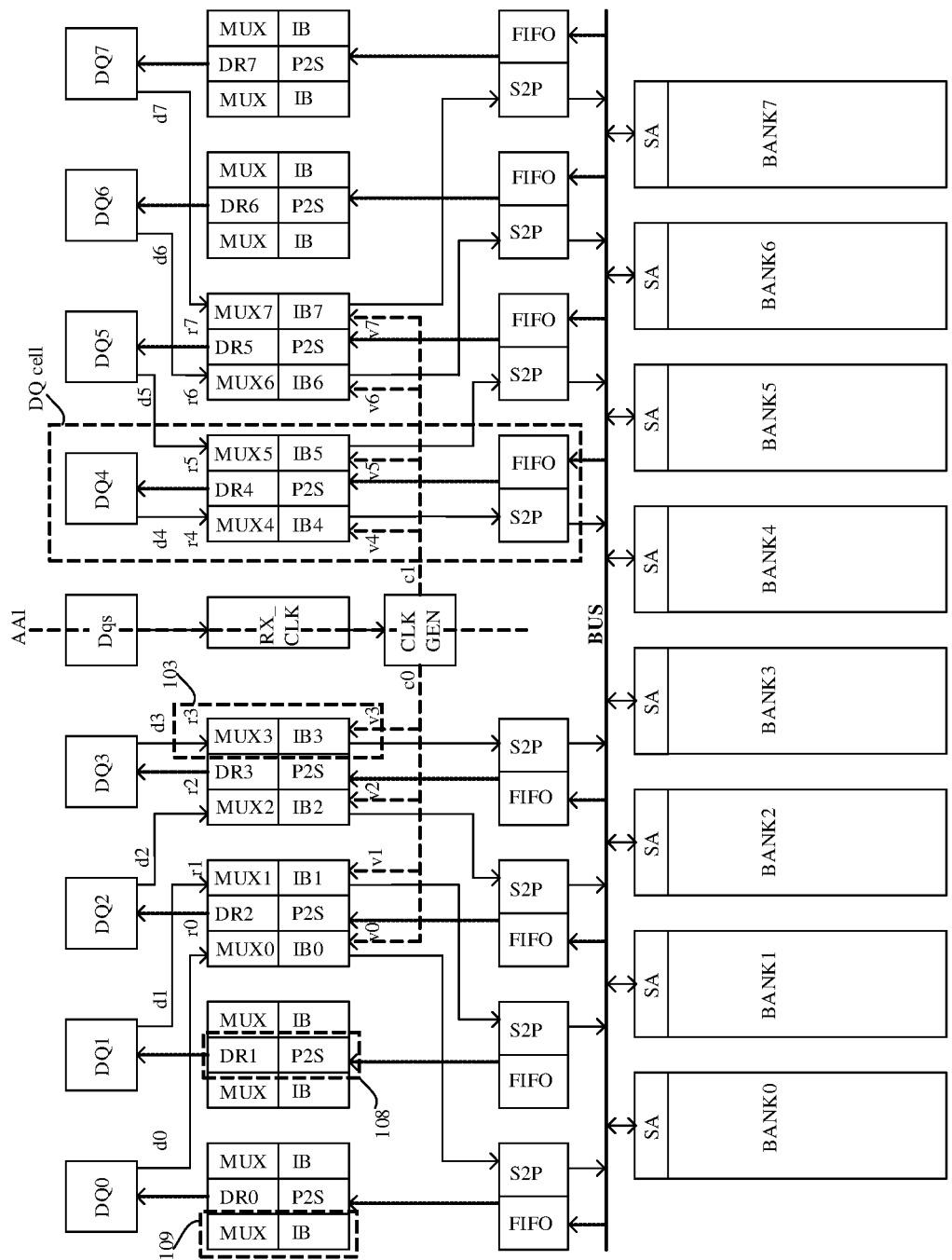
FIG. 10 is a layout schematic diagram of a data transmission circuit according to an embodiment of the disclosure.

Embodiments of the disclosure further provide a data transmission circuit, which includes the interface circuit in the embodiments described above; and M sequential-to-parallel conversion circuits, the M sequential-to-parallel conversion circuits are in one-to-one correspondence with the M input buffer circuits, and the output of each input buffer circuit serves as the input of the corresponding sequential-to-parallel conversion circuit. FIG. 10 is a layout schematic diagram of a data transmission circuit according to an embodiment of the disclosure.

Referring to FIG. 10, each input buffer circuit 103 may include a multiplexer (mux) and a latch, where the multiplexer receives data signals, processes the data signals and outputs the processed data signals to the latch, and the output of the latch serves as the output of the input buffer circuit 103. In FIG. 10, the multiplexers corresponding to 8 input buffer circuits 103 are denoted by MUX0, MUX1, MUX2, MUX3, MUX4, MUX5, MUX6, MUX7, and the latches corresponding to the 8 input buffer circuits 103 are denoted by IB0, IB1, IB2, IB3, IB4, IB5, IB6, IB7. In the embodiment, the data transmission circuit includes: the interface circuit in the embodiments described above; and M Sequential-to-parallel (S2P) conversion circuits. The M S2P conversion circuits are in one-to-one correspondence with the M input buffer circuits 103, and the output of each input buffer circuit 103 serves as the input of the corresponding S2P conversion circuit.

Specifically, M S2P conversion circuits are arranged in the third row, and the lengths of transmission paths between the input buffer circuits 103 on the same side of the axis AA1 and the S2P conversion circuits S2P corresponding to the input buffer circuits 103 are different.

More specifically, the lengths of transmission paths between the latches corresponding to the input buffer circuits 103 on the same side of the axis AA1 and the corresponding S2P conversion circuits are different.

In addition, the M S2P conversion circuits are in one-to-one correspondence with the M data pads 101, and the distances between the S2P conversion circuits and the data pads 101 corresponding to the S2P conversion circuits are the same. It may be considered that each S2P conversion circuit is laid out directly below the corresponding data pad 101.

In the embodiment, the data transmission circuit may further include: M First Input First Output circuits (Output FIFO) in one-to-one correspondence with the M S2P conversion circuits; M Parallel-to-sequential (P2S) conversion circuits in one-to-one correspondence with the M Output FIFO circuits, where the output of each Output FIFO serves as the input of the P2S conversion circuit corresponding to the Output FIFO circuit; and M driving circuits in one-to-one correspondence with the M P2S conversion circuits, where the output of each P2S conversion circuit serves as the input of a driving circuit corresponding to the P2S conversion circuit, and the M driving circuits are in one-to-one correspondence with the M lower-layer data pads 101. Driving circuits corresponding to 8 data pads 101 are denoted by DR0, DR1, DR2, DR3, DR4, DR5, DR6, DR7 in FIG. 10. In the embodiment, the P2S conversion circuits are arranged directly below the data pads 101, located between adjacent latches and arranged in the same row with the latches. The driving circuits are arranged directly below the data pads 101 and are located between the data pads 101 and the row where the multiplexers are located.

It can be understood that the driving circuits and the corresponding P2S conversion circuits form output buffer circuits 108.

The data transmission circuit may further include pre-driving circuits electrically connected to the driving circuits and located between the driving circuits and the P2S conversion circuits. In the embodiment, a pre-driving circuit may be located between adjacent multiplexers and arranged in the same row with the multiplexers.

The data transmission circuit may further include an electrostatic discharge circuit, a capacitor and the like.

The data transmission circuit may further include M optional input buffer circuits 109, which have the same number as the input buffer circuits 103 and are arranged side by side with the input buffer circuits 103. For detailed description of the optional input buffer circuits 109, reference is made to the previous embodiment.

Specifically, each optional input buffer circuit 109 includes an optional multiplexer and an optional latch, where the optional multiplexer and the multiplexer are arranged side by side, the optional latch and the latch are arranged side by side. The multiplexer is denoted by MUX and the optional latch is denoted by IB in FIG. 10. As previously described, the multiplexer and the latch that are not used for signal transmission and are furthest from the axis AA1 are taken as the optional multiplexer and the optional latch, respectively.

In the embodiment, two of the M input buffer circuits 103 and/or the M optional input buffer circuits 109, one of the M S2P conversion circuits, one of the M Output FIFO circuits, one of the M P2S conversion circuits and one of the M driving circuits jointly form a data transmission unit, also called DQ cell, so as to obtain a plurality data transmission units or DQ cells. The operating environment of the each of the data transmission units DQ cells is matched with each other.

The operating environment being matched refers to that for each DQ cell, latches or optional latches are distributed on two sides of each P2S conversion circuit. Therefore, the operating environment of each of the S2P conversion circuits is consistent with each other, for example, the noise interference degree is consistent.

For example, for the data pad denoted by DQ5, the DQ cell includes an input buffer circuit 103, an optional input buffer circuit 109, an Output FIFO circuit, a S2P conversion circuit S2P, and a driving circuit. For the data pad denoted by DQ4, the DQ cell includes an input buffer circuit 103, an optional input buffer circuit 109, an Output FIFO circuit, a S2P conversion circuit and a driving circuit. For the data pad denoted by DQ6, the DQ cell includes two optional input buffer circuits 109, an Output FIFO circuit, a S2P conversion circuit and a driving circuit.

In one example, the S2P conversion circuit and the Output FIFO circuit in the same DQ cell are arranged in parallel, that is, the S2P conversion circuit and the Output FIFO circuit in the same data transmission unit DQ cell are located in the same row.

In another example, the S2P conversion circuit and the Output FIFO circuit in the same DQ cell are arranged side by side, that is, the S2P conversion circuit and the Output FIFO circuit in the same data transmission unit DQ cell are located in the different rows, and the Output FIFO circuit is positioned between the S2P conversion circuit and the input buffer circuit 103.

Furthermore, in other embodiments, the Output FIFO circuits located in different data transmission units may also be arranged side by side.

For ease of understanding, FIG. 10 illustrates a bus (BUS), sense amplifiers (SA), and a plurality of memory blocks, where 8 memory blocks are denoted by BANK0, BANK1, BANK2, BANK3, BANK4, BANK5, BANK6, BANK7. In other embodiments, the number of the memory blocks may be reasonably set according to the desired performance.

In FIG. 10, the dashed arrows illustrate the data paths and the clock paths during reading of data from the memory blocks, that is, the data paths and the clock paths for reading the data from the memory blocks to the corresponding data pads 101; and the solid arrows illustrate the data paths and the clock paths during writing of data to the memory blocks, that is, the data paths and the clock paths for storing the data from the data pads 101 to the corresponding memory blocks. It is to be noted that the solid arrows in the above-mentioned figures also refer to the data paths and the clock paths during data writing, and the dashed arrows refer to the data paths and the clock paths during reading of the data.

The operating principle of the data transmission circuit according to the embodiment of the disclosure will be described below in combination with the drawings.

During data writing, taking the data pad DQ6 as an example, DQ6 transmits a data signal to the multiplexer MUX6, and the multiplexer MUX6 transmits the data signal to the latch IB6; a clock signal provided by a clock generating circuit 115 are transmitted to the latch IB6 after passing through a length of the clock path; after the clock signal reaches the latch IB6, the latch IB6 transmits the data signal to the S2P conversion circuit under the driving of the clock signal; and the S2P conversion circuit transmits the data signals to the bus BUS, and the data signal is amplified by a sense amplifier SA and then stored in the corresponding memory block BANK6. According to related analysis of the interface circuit as described above, for the DQ0/DQ1/DQ2/DQ3/DQ4/DQ5/DQ6/DQ7, the length of the clock path required to be passed through by the clock signal to reach the corresponding latch is short, and the difference among the lengths of the clock paths is small. Therefore, the time delay of the latch corresponding to the DQ0/DQ1/DQ2/DQ3/DQ4/DQ5/DQ6/DQ7 for transmitting the data signals to the corresponding S2P conversion circuits is small, so that the matching degree of the data path and the clock path corresponding to each input buffer circuit is improved, the difference value of the time required for writing the data of different data pads 101 into the corresponding memory blocks is reduced, and the writing performance is improved.

During data reading, continuing to take the data pad DQ6 as an example, for example, a data signal from the memory block BANK6 is amplified by the SA and then transmitted to the BUS; the data signal is transmitted to the corresponding Output FIFO circuit through the BUS; the output FIFO circuit transmits the data signal to the P2S conversion circuit, and the data signal passes through the P2S conversion circuit, a pre-driving circuit and a driving circuit DR6 and then reaches the data pad DQ6.

In the data transmission circuit provided by the embodiment of the disclosure, the centralized layout of the input buffer circuits is adopted, so that the length of the clock path through which the clock signal is transmitted to each input buffer circuit is shortened, the matching degree of the clock path and the data path is improved, and thus tDQS2DQ and timing violations are reduced. The difference among the lengths of the clock paths corresponding to the input buffer circuits is small, and thus the requirement for high matching degree of the clock paths and the data paths of the input buffer circuits may be met at the same time.

In addition, as the lengths of the clock paths are shortened, the length of a wire for transmitting the clock signals is correspondingly shortened, and thus the power consumption of the data transmission circuit may be reduced to a certain extent.

Figure 11:
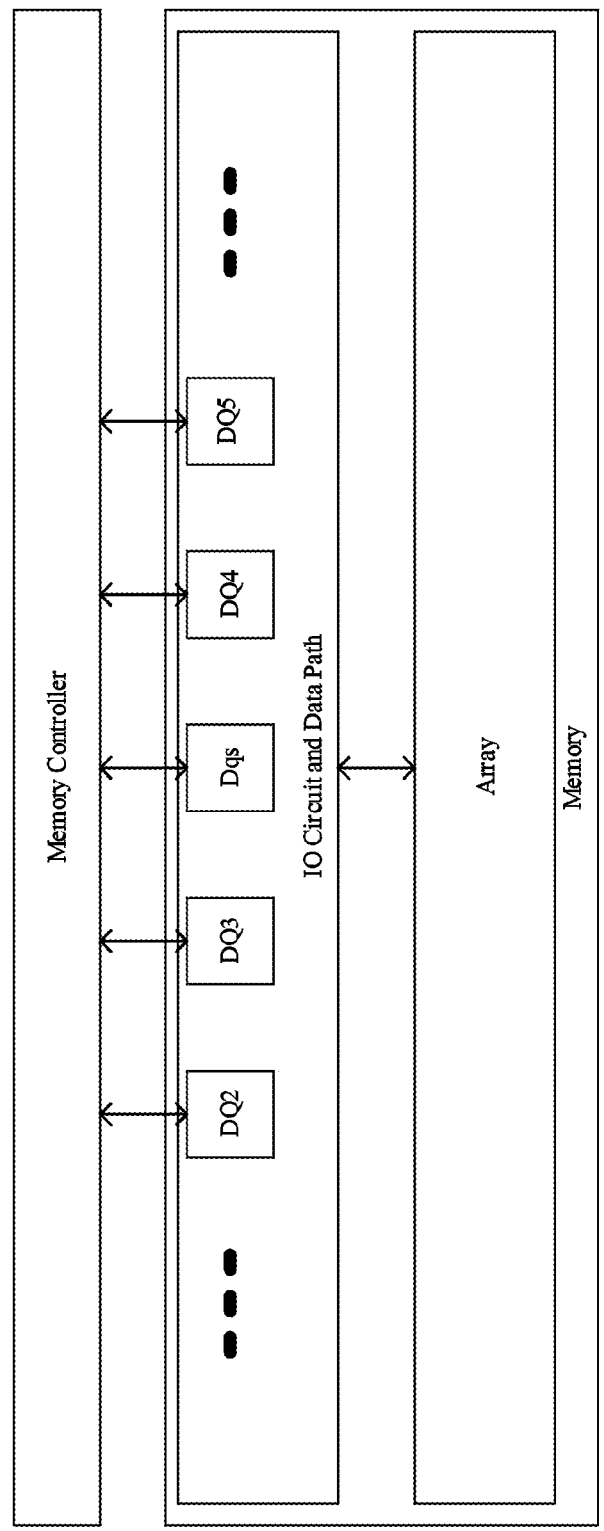
FIG. 11 is a structural schematic diagram illustrating that a memory is applied to a storage system according to an embodiment of the disclosure.

Correspondingly, according to an embodiment of the disclosure, a memory is provided, which includes the interface circuit as described above. Specifically, reference is made to FIG. 10 for a structural diagram of the memory. The memory described above may be applied in a memory system shown in FIG. 11. FIG. 11 is a structural schematic diagram illustrating that a memory is applied to a memory system according to an embodiment of the disclosure, in which Memory Controller is a controller, Memory is a memory, IO Circuit is an interface circuit, Data Path is a data path, and Array is a memory array. IO Circuit may for example be the interface circuit of the disclosure, Data Path may for example include the transmission circuit of the disclosure, DQ2/DQ3/DQ4/DQ5 are data pads, and Dqs is a clock pad.

The memory may be DRAM, SRAM, MRAM, FeRAM, PCRAM, NAND, NOR, or the like. For example, the memory may be an LPDDR4 memory or an LPDDR5 memory.

It can be understood by those of ordinary skill in the art that the implementation modes described above are specific embodiments for implementing the present disclosure, and in practical applications, various changes in form and detail may be made therein without departing from the spirit and scope of the present disclosure. Any person skilled in the art may make various changes and modifications without departing from the spirit and scope of the disclosure, and therefore the scope of the disclosure should be defined by the claims. It can be understood by those of ordinary skill in the art that the implementation modes described above are specific embodiments for implementing the present disclosure, and in practical applications, various changes in form and detail may be made therein without departing from the spirit and scope of the present disclosure. Any person skilled in the art may make various changes and modifications without departing from the spirit and scope of the disclosure, and therefore the scope of the disclosure should be defined by the claims.

The invention claimed is:

1. An interface circuit, comprising:
a clock pad, configured to transmit a clock signal;
M data pads, configured to transmit data signals; and
M input buffer circuits in one-to-one correspondence with the data pads, each of the input buffer circuits being driven by the clock signal to receive a data signal transmitted by a data pad corresponding to the input buffer circuit,
wherein the clock pad and the data pads are arranged in a first row, and the M data pads are arranged on two sides of the clock pad, half of the M data pads being arranged on each side, wherein the M input buffer circuits are arranged in a second row and form an axis perpendicular to the first row with the clock pad as reference, and the M input buffer circuits are arranged on two sides of the axis, half of the M input buffer circuits being arranged on each side, and wherein a distance between each of the input buffer circuits and the axis is smaller than a distance between the data pad corresponding to the input buffer circuit and the axis, M being an integer larger than or equal to 2.

2. The interface circuit of claim 1, wherein a length of an input data path between each of the input buffer circuits and the data pad corresponding to the input buffer circuit is a first length, and a length of a clock path between each of the input buffer circuits and the clock pad is a second length, wherein the first length and the second length are in positive correlation.

3. The interface circuit of claim 1, wherein the clock pad is a differential input pad and comprises a first clock pad and a second clock pad, and the first clock pad and the second clock pad respectively transmit complementary clock signals.

4. The interface circuit of claim 3, wherein the first clock pad and the second clock pad are symmetrically arranged with respect to the axis.

5. The interface circuit of claim 1, further comprising a clock processing circuit, electrically connected with the clock pad and the M input buffer circuits and configured to receive the clock signal and process the clock signal to serve as a driving clock for the M input buffer circuits.

6. The interface circuit of claim 5, wherein the clock processing circuit comprises a clock receiving circuit and a clock generating circuit, wherein the clock receiving circuit is electrically connected with the clock pad and configured to receive the clock signal, and an output of the clock receiving circuit serves as an input of the clock generating circuit, and wherein the clock generating circuit is configured to generate the driving clock.

7. The interface circuit of claim 1, further comprising:
   a mark pad, configured to transmit a mark signal; and
   a mark buffer circuit, corresponding to the mark pad and configured to receive the mark signal transmitted by the mark pad under driving of the clock signal.

8. The interface circuit of claim 7, wherein the mark pad is arranged in the first row and located between the data pads and the clock pad; the mark buffer circuit is arranged in the second row, located on the same side of the axis as the mark pad, and is located between the input buffer circuits and the axis; and wherein a distance between the mark buffer circuit and the axis is smaller than a distance between the mark pad corresponding to the mark buffer circuit and the axis.

9. The interface circuit of claim 1, further comprising M output buffer circuits in one-to-one correspondence with the data pads, each of the output buffer circuits being driven by the clock signal to transmit the data signals to the corresponding data pads.

10. The interface circuit of claim 9, wherein lengths of output data paths from each of the output buffer circuits to a data pad corresponding to the output buffer circuit are the same.

11. The interface circuit of claim 1, wherein each input buffer circuit comprises a multiplexer and a latch, the multiplexer receives the data signals, processes the data signals and outputs the processed data signals to the latch, and wherein an output of the latch serves as an output of the input buffer circuit.

12. A data transmission circuit, comprising the interface circuit of claim 1, and further comprising:
    M sequential-to-parallel conversion circuits, wherein the M sequential-to-parallel conversion circuits are in one-to-one correspondence with the M input buffer circuits, and an output of each of the input buffer circuit serves as an input of a corresponding sequential-to-parallel conversion circuit.

13. The data transmission circuit of claim 12, wherein the M sequential-to-parallel conversion circuits are arranged in a third row, and lengths of transmission paths between each of the input buffer circuits on the same side of the axis and a sequential-to-parallel conversion circuit corresponding to the input buffer circuit are different.

14. The data transmission circuit of claim 12, wherein the M sequential-to-parallel conversion circuits are in one-to-one correspondence with the M data pads, and distances between each of the sequential-to-parallel conversion circuits and a data pad corresponding to the sequential-to-parallel conversion circuit are the same.

15. The data transmission circuit of claim 12, further comprising:
    M First Input First Output (FIFO) circuits in one-to-one correspondence with the M sequential-to-parallel conversion circuits;
    M parallel-to-sequential conversion circuits in one-to-one correspondence with the M FIFO circuits, wherein an output of each FIFO circuit serves as an input of the corresponding parallel-to-sequential conversion circuit; and
    M driving circuits in one-to-one correspondence with the M parallel-to-sequential conversion circuits, wherein an output of each parallel-to-sequential conversion circuit serves as an input of a driving circuit corresponding to the parallel-to-sequential conversion circuit, and the M driving circuits are in one-to-one correspondence with the M data pads.

16. The data transmission circuit of claim 15, further comprising M optional input buffer circuits, wherein the M optional input buffer circuits have the same number as the input buffer circuits and are arranged side by side with the input buffer circuits.

17. The data transmission circuit of claim 16, wherein at least one of two of the M input buffer circuits or the M optional input buffer circuits, one of the M sequential-to-parallel conversion circuits, one of the M FIFO circuits, one of the M parallel-to-sequential conversion circuits and one of the M driving circuits jointly form a data transmission unit to obtain a plurality of data transmission units, wherein operating environments of each of the data transmission units are matched.

18. The data transmission circuit of claim 17, wherein the sequential-to-parallel conversion circuits and the FIFO circuits in the same data transmission unit are arranged in side by side or in parallel.

19. The data transmission circuit of claim 17, wherein the FIFO circuits located in different data transmission units are arranged side by side.

20. A memory, comprising the data transmission circuit of claim 12.

* * * * *